(12) United States Patent
Cox et al.

(10) Patent No.: US 7,256,866 B2
(45) Date of Patent: Aug. 14, 2007

(54) LITHOGRAPHIC APPARATUS AND DEVICE MANUFACTURING METHOD

(75) Inventors: Henrikus Herman Marie Cox, Eindhoven (NL); Hans Butler, Best (NL); Ronald Casper Kunst, Eindhoven (NL); Harmen Klaas Van Der Schoot, Vught (NL); Youssef Karel Maria De Vos, Lille (BE)

(73) Assignee: ASML Netherlands B.V., Veldhoven (NL)

(*) Notice: Subject to any disclaimer, the term of this patent is extended or adjusted under 35 U.S.C. 154(b) by 140 days.

(21) Appl. No.: 10/961,391

(22) Filed: Oct. 12, 2004

(65) Prior Publication Data

US 2006/0077364 A1    Apr. 13, 2006

(51) Int. Cl.
G03B 27/42    (2006.01)
G03B 27/58    (2006.01)
G03B 27/62    (2006.01)

(52) U.S. Cl. ............................. 355/53; 355/72; 355/75
(58) Field of Classification Search ................. 355/72, 355/53, 75
See application file for complete search history.

(56) References Cited

U.S. PATENT DOCUMENTS

| | | | |
|---|---|---|---|
| 5,877,845 A | | 3/1999 | Makinouchi |
| 5,907,392 A | * | 5/1999 | Makinouchi .................. 355/53 |
| 5,940,789 A | * | 8/1999 | Yuan .......................... 702/150 |
| 5,986,743 A | * | 11/1999 | Hanzawa ..................... 355/53 |
| 6,069,683 A | * | 5/2000 | Iwamoto ...................... 355/53 |
| 6,260,282 B1 | * | 7/2001 | Yuan et al. .................. 33/1 M |
| 2001/0021009 A1 | * | 9/2001 | Yuan et al. .................... 355/53 |
| 2002/0048006 A1 | * | 4/2002 | Mishima ....................... 355/53 |
| 2002/0054280 A1 | * | 5/2002 | Tokuda et al. ................. 355/53 |
| 2002/0140921 A1 | * | 10/2002 | Morisada ...................... 355/73 |
| 2003/0030779 A1 | * | 2/2003 | Hara ............................ 355/53 |
| 2003/0071981 A1 | * | 4/2003 | Ueta ............................ 355/72 |
| 2003/0098962 A1 | * | 5/2003 | Kubo ........................... 355/72 |
| 2003/0128345 A1 | * | 7/2003 | Inoue et al. ................... 355/53 |
| 2004/0027552 A1 | * | 2/2004 | Kikuchi et al. ................ 355/75 |

FOREIGN PATENT DOCUMENTS

| | | |
|---|---|---|
| EP | 0 967 525 A2 | 12/1999 |
| EP | 1 265 104 A1 | 12/2002 |
| GB | 2 300 275 A | 10/1996 |

OTHER PUBLICATIONS

European Search Report issued in EP 05 07 7329 dated Jan. 17, 2006.

* cited by examiner

Primary Examiner—W. B. Perkey
Assistant Examiner—Kevin Gutierrez
(74) Attorney, Agent, or Firm—Pillsbury Winthrop Shaw Pittman LLP

(57) ABSTRACT

To enable high acceleration and high moving speed of a pattern support or a substrate table of a lithographic apparatus, one of the pattern support and the substrate table is supported by an actuator for relatively large displacements, whereas an actuator for accurately positioning is omitted. The other one of the pattern support and the substrate table is supported by an actuator assembly including an actuator for accurate positioning and an actuator for relatively large displacements. An alignment accuracy of a patterning device and a substrate is achieved by providing a control system that is adapted to position the other one of the pattern support and the substrate table such that a positioning error of the one of the pattern support and the substrate table is compensated by the positioning of the other one.

18 Claims, 3 Drawing Sheets

LITHOGRAPHIC APPARATUS AND DEVICE MANUFACTURING METHOD

BACKGROUND

1. Field of the Invention

The present invention relates to lithographic apparatus and methods.

2. Description of Related Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

To project the pattern on the substrate, it is desirable that the patterning device and the substrate be accurately aligned, i.e. positioned with respect to each other. Further, the patterning device and the substrate may need to be aligned with respect to the radiation beam and/or other devices that are included in the lithographic apparatus.

In conventional lithographic apparatus, both the substrate table and the pattern support are provided with an actuator assembly that is configured to accurately position the substrate and the patterning device with respect to a reference point. The actuator assembly may include a long stroke actuator and a short stroke actuator. The long stroke actuator and the short stroke actuator are operatively coupled to enable to move the substrate or patterning device over a relatively large distance using the long stroke actuator and to accurately position the substrate or patterning device using the short stroke actuator. It is noted that an actuator for moving an object over a large distance, such as the long stroke actuator, is by itself generally unsuited for accurately positioning.

SUMMARY

According to an embodiment of the invention, there is provided a lithographic apparatus including an illumination system configured to condition a radiation beam; a pattern support constructed to support a patterning device, the patterning device being capable of imparting the radiation beam with a pattern in its cross-section to form a patterned radiation beam, the pattern support being moveably supported by a first actuator assembly, the first actuator assembly including a long stroke actuator for positioning the patterning device with respect to a fixed reference point; a substrate table constructed to hold a substrate, the substrate table being moveably supported by a second actuator assembly, the second actuator assembly including a long stroke actuator and a short stroke actuator for positioning the substrate with respect to the fixed reference point; a projection system configured to project the patterned radiation beam onto a target portion of the substrate; and a control system including a determination system for determining an actual position of the patterning device, and control circuitry operatively connected to the determination system, the first actuator assembly, and the second actuator assembly, the control circuitry being configured to: position the patterning device to obtain a desired pattern position; determine a pattern positioning error by comparing the desired pattern position and the momentary position; determine a desired substrate position to substantially compensate the pattern positioning error; and position the substrate at the desired substrate position.

According to an embodiment of the invention, there is provided a lithographic apparatus comprising: an illumination system configured to condition a radiation beam; a pattern support constructed to support a patterning device, the patterning device being capable of imparting the radiation beam with a pattern in its cross-section to form a patterned radiation beam, the pattern support being moveably supported by a first actuator assembly, the first actuator assembly including a long stroke actuator and a short stroke actuator for positioning the patterning device with respect to a fixed reference point; a substrate table constructed to hold a substrate, the substrate table being moveably supported by a second actuator assembly, the second actuator assembly including a long stroke actuator for positioning the substrate with respect to the fixed reference point; and a projection system configured to project the patterned radiation beam onto a target portion of the substrate, a control system including a determination system for determining an actual position of the substrate, and control circuitry operatively connected to the determination system, the first actuator assembly, and the second actuator assembly, the control circuitry being configured to position the substrate to obtain a desired substrate position; determine a substrate positioning error by comparing the desired substrate position and the actual position; determine a desired patterning device position to substantially compensate the substrate positioning error; and position the patterning device at the desired patterning device position.

A device manufacturing method, in accordance with an embodiment of the invention, includes patterning a beam of radiation with a patterning device to obtain a patterned beam of radiation; projecting the patterned beam of radiation onto a substrate, and controlling a position of the substrate, the controlling including determining an actual position of the patterning device, positioning the patterning device to a desired patterning device position; determining a patterning device positioning error by comparing the desired patterning device position and the actual position of the patterning device; determining a desired substrate position to substantially compensate the patterning device positioning error; and positioning the substrate at the desired substrate position.

Embodiments of the present invention include an actuator assembly and a support structure suitable for a high acceleration and a high velocity with a relatively low mass and thus lower heat generation.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
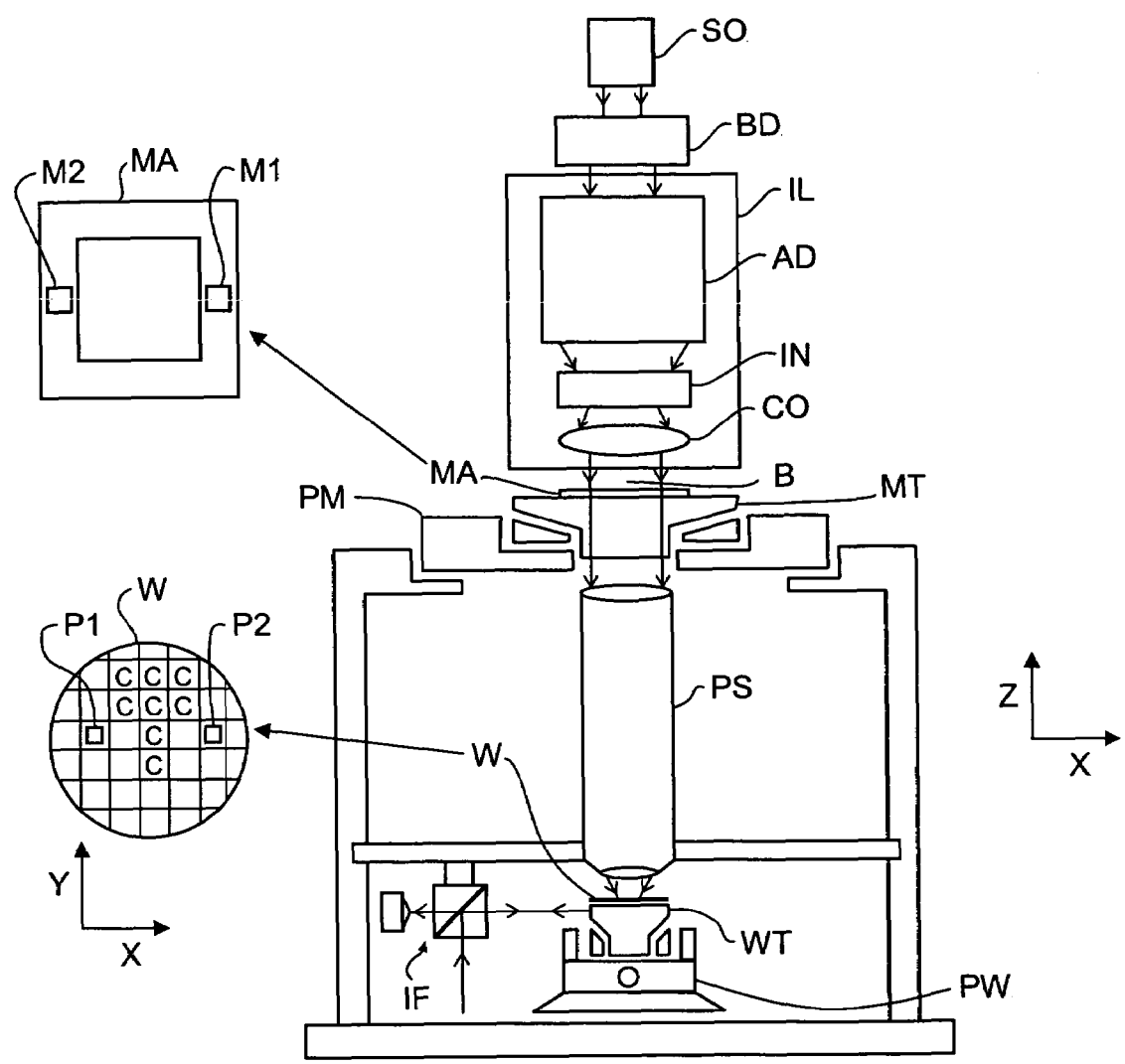
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B. (e.g. UV radiation) and a support structure (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT configured to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioning device PM. Similarly, in general, movement of the substrate table WT may be realized using a long-stroke module and a short-stroke module, which form part of the second positioning PW. In the case of a stepper (as opposed to a scanner) the mask table MT may be connected to a short-stroke actuator only, or may be fixed. In another embodiment of the present invention, the mask table MT or the substrate table WT may be connected to a long-stroke actuator only. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

Step mode: the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

Scan mode: the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

Another mode: the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
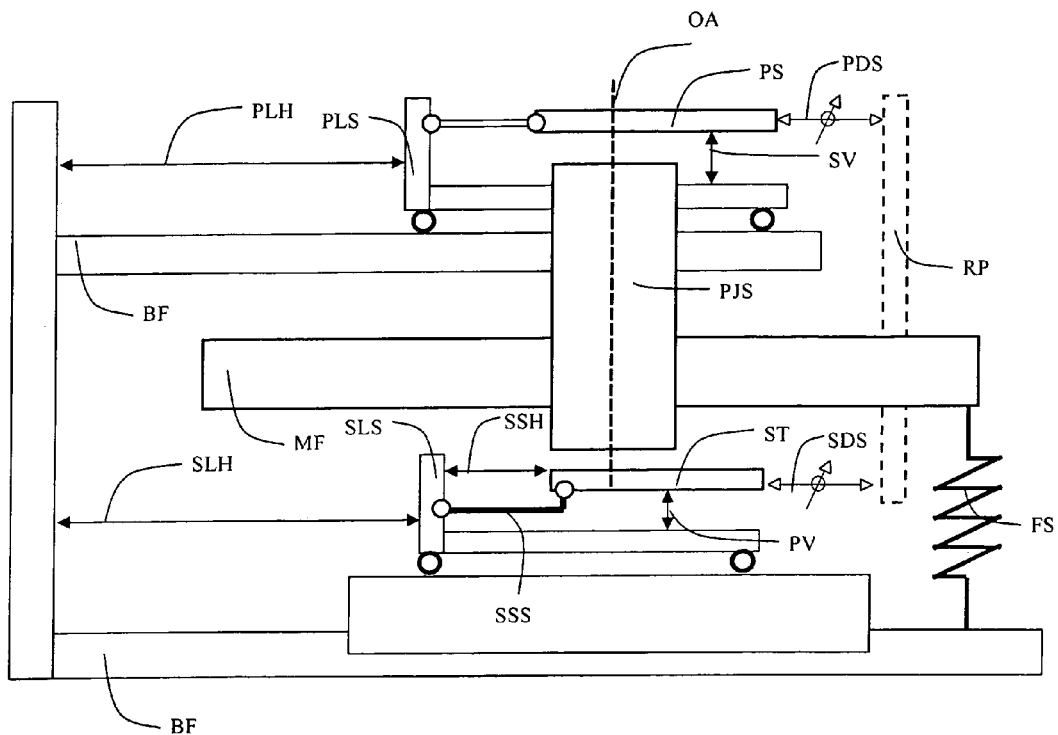
FIG. 2 schematically depicts a lithographic apparatus according to an embodiment of the present invention.

FIG. 2 illustrates a lithographic apparatus according to an embodiment of the present invention having a base frame BF, a projection system PJS coupled to a metrology frame MF, which is isolated from the BF by a soft suspension system FS (e.g. air-mounts or very soft mechanical strings). A reference plane RP is indicated by a dashed line. The reference plane RP is parallel to an optical axis OA of the projection system PJS, but may also be selected differently.

A pattern support PS is positioned at a first end of the optical axis OA and a substrate table ST is positioned at the other end of the optical axis OA. During operation a patterning device is positioned on the pattern support PS and a substrate is positioned on the substrate table ST. A radiation beam is generated and guided through the patterning device along the optical axis OA to the substrate on the substrate table ST. For a correct projection on the substrate, the patterning device, the projection system PJS and the substrate need to be aligned. It is noted, however, that a positioning accuracy for the alignment between the substrate and the patterning device may be higher than a positioning accuracy for the alignment between the substrate relative to the projection system PJS, or the alignment of the patterning device relative to the projection system PJS.

For stepping or scanning during operation, the pattern support PS and the substrate table ST are provided with an actuator assembly. As mentioned above, it is desirable to have a lightweight support structure resulting in relatively small motor forces and less heat generation. To provide a lightweight support, e.g. a lightweight pattern support PS, a short stroke actuator may be omitted. The positioning accuracy of the actuator corresponding assembly, however, then deteriorates.

In European Patent Application Nos. 0 967 525 and EP 1 265 104, a control system is disclosed, which control system is configured to position a substrate table and a pattern support. In that control system, errors in a position of the substrate table are compensated by a feed-forward control in a pattern support control loop. Such a control system provides accurate positioning of the substrate and the patterning device relative to each other. The patterning device and the substrate may also be accurately positioned with respect to a reference point, i.e. any other device. Based on the realization that this control system may accurately position the substrate table ST and the pattern support PS with respect to each other when only one of the substrate table ST and the pattern support PS may be accurately positioned with respect to a reference point, the present invention employs a similar control system advantageously to be able to omit the short stroke actuator.

Referring to FIG. 2 again, the actuator assembly configured to move the substrate table ST includes a substrate long stroke actuator SLS configured to move the substrate in a first degree of freedom over a relatively large distance SLH and a substrate short stroke actuator SSS configured to move the substrate in the first degree of freedom over a relatively short distance SSH. More actuators may be provided, for example to move the substrate table ST in more than one degree of freedom PV. A substrate position determination system SDS may be provided to determine a position of the substrate with respect to the reference plane RP. Examples of position determination system include an interferometer system or an encoder system. An encoder system includes a grating and an optical encoder detecting the grating.

An actuator assembly configured to move the pattern support PS includes a pattern long stroke actuator PLS configured to move the patterning device in the first degree of freedom over a relatively large distance PLH. More actuators may be provided, for example to move the pattern support PS in more than one degree of freedom SV. A pattern position determination system PDS, such as an interferometer system or an encoder system, is provided to determine a position of the patterning device with respect to the reference plane RP.

Since the substrate table ST is provided with a short stroke actuator, the substrate table ST and thus the substrate may be accurately positioned in the first degree of freedom with respect to the reference plane RP. Since the pattern support PS is not provided with a short stroke actuator, the patterning device may be positioned in the first degree of freedom with a relatively low positioning accuracy with respect to the reference plane RP. A positioning error resulting from the relatively low positioning accuracy may however be compensated by positioning the substrate corresponding to the actual position of the patterning device.

Figure 3:
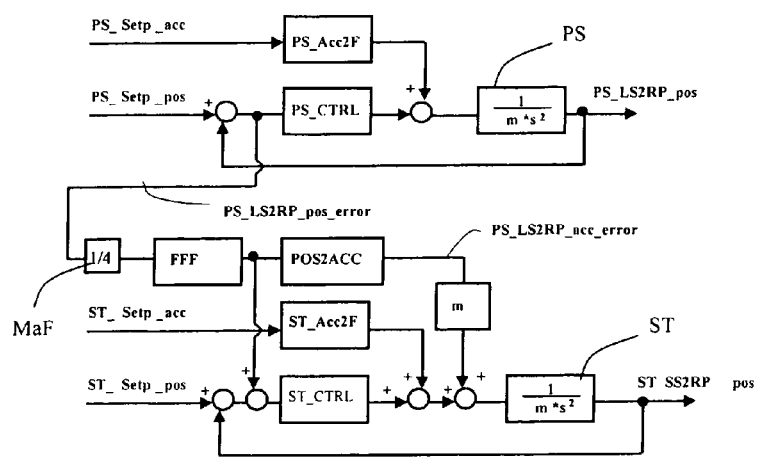
FIG. 3 shows a control diagram of a control system according to an embodiment of the present invention.

FIG. 3 shows a control scheme for controlling the position of the substrate table ST and of the pattern support PS according to an embodiment of the present invention. To position the pattern support PS, a desired pattern support position set point PS_Setp_pos and a desired pattern support acceleration set point PS_Setp_acc are input into control circuitry of the control system. A first filter PS_Acc2F filters the desired acceleration PS_Setp_acc to a desired force. From the desired position PS_Setp_pos, an actual position PS_LS2RP_pos, determined by the position determination system (PDS in FIG. 2), is subtracted, resulting in a position error PS_LS2RP_pos_error with respect to the reference point or plane. The position error PS_LS2RP_pos_error is input to a controller PS_CTRL, such as PID controller, to obtain a suitable force for moving the pattern support PS to the desired position PS_Setp_pos. The mechanical characteristics of the pattern support PS are shown as a filter for the generated forces outputting the actual position of the pattern support PS. As mentioned above, the pattern support PS is not accurately positioned, since a short stroke actuator is omitted. To compensate for the resulting positioning error, the position error PS_LS2RP_pos_error is supplied to the control circuitry for controlling the movement of the substrate table ST.

The substrate table ST may be controlled using similar control circuitry, including a second filter ST_Acc2F for filtering a desired acceleration ST_Setp_acc to a desired force added to a force output by a controller ST_CTRL which controller ST_CTRL receives a signal corresponding to a desired position ST_Setp_pos and an actual position ST_SS2RP_pos. The substrate table ST is further controlled by a force generated by a feed-forward circuit receiving the positioning error PS_LS2RP_pos_error of the pattern support PS. This positioning error PS_LS2RP_pos_error is added to the position set point ST_Setp_pos after filtering by a magnification filter MaF and possibly another feed-forward filter FFF. These filters are described hereinafter.

Further, the positioning error PS_LS2RP_pos_error is fed to a time differentiation filter POS2ACC for differentiating the positioning error PS_LS2RP_pos_error twice with respect to time thereby determining a pattern support acceleration error PS_LS2RP_acc_error. Filtering this acceleration error PS_LS2RP_acc_error with the mass m of the substrate table ST determines a suitable force to be exerted on the substrate table ST for feed-forward compensating the acceleration error PS_LS2RP_acc_error. Thus, the feed-forward of the positioning error PS_LS2RP_pos_error to the control circuit of the substrate table ST enables to compensate for a positioning error PS_LS2RP_pos-error and/or an acceleration error of the pattern support PS_LS2RP_acc_error by adjusting the desired position and/or the desired acceleration of the substrate table ST.

As mentioned above, the feed-forward circuit may be provided with a magnification filter MaF. The magnification filter MaF may compensate a magnification of the projection system, since such a magnification may result in a different desired position and speed for patterning device and substrate. For example, with a magnification of ¼ of the projection system, a displacement of the patterning device with respect to the projection system, may be compensated by a displacement of the substrate ¼ times as large as the displacement of the patterning device with respect to the projection system. Therefore, also the positioning error PS_LS2RP_pos_error needs to be corrected for this magnification.

It is noted that the magnification may result in a preferred embodiment of the present invention. As shown in FIG. 3, the magnification of the projection system may be ¼. Therefore, the pattern support PS needs to move and accelerate four times faster than the substrate table ST. Since omission of the short stroke actuator enables a high speed and a larger acceleration, it may be preferred to omit the short stroke actuator from the actuator assembly of the support structure, e.g. the pattern support PS, that is required to move and accelerate more than the other. Which support structure is required to move and accelerate faster depends on the magnification, and may therefore as well be the substrate table ST.

The feed-forward circuit may also be provided with a feed-forward filter FFF, for example to adapt the control circuit to predetermined resonance frequencies, a desired bandwidth, or any other characteristic or specification. The feed-forward filter FFF may include a time delay filter for compensating a time delay occurring in the time differentiation filter POS2ACC when determining the acceleration error PS_LS2RP_acc_error from the positioning error PS_LS2RP_pos_error. The control circuit may as well be provided with a prediction circuit, e.g. as disclosed in European Patent application No. 1 265 104, incorporated herein by reference.

From the above description of FIGS. 2 and 3, a person skilled in the art readily understands how the lithographic apparatus, in particular the control system, pattern support PS and substrate table ST, functions. During operation, the patterning device is positioned with respect to the projection system PJS using a long stroke actuator in a first degree of freedom (and using possibly other actuators in other degrees of freedom). The patterning device position determination system PDS measures the actual position of the patterning device and the control system determines the resulting positioning error by a comparison with the desired position. The positioning error is supplied to the control circuitry for controlling the substrate table ST. The substrate table ST is then controlled such that the substrate is accurately positioned with respect to the patterning device and such that the positioning error of the substrate and the patterning device with respect to the projection system does not exceed a predetermined positioning error value.

Figure 4:
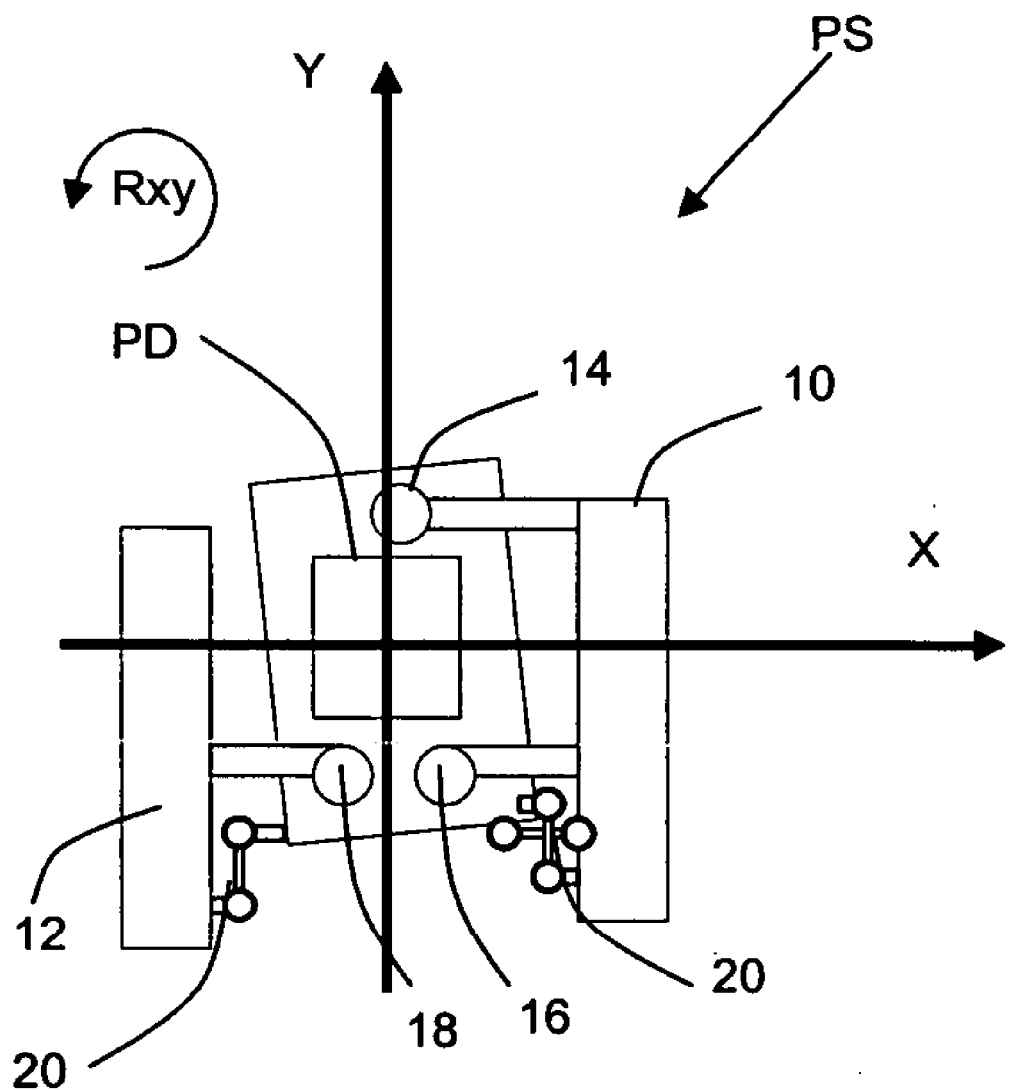
FIG. 4 schematically depicts a pattern support according to an embodiment of the present invention.

FIG. 4 illustrates a pattern support PS for use in the lithographic apparatus according to FIG. 2. In a X-direction, the pattern support PS is mechanically coupled to a long stroke Y-actuator (not shown) for moving in a first degree of freedom X. The pattern support PS includes two actuators 10, 12 for moving a patterning device PD in a second degree of freedom Y and for rotating the patterning device PD in a plane defined by X and Y, thus providing a third degree of freedom Rxy. The pattern support PS further includes three actuators 14, 16, 18 for moving the patterning device PD in a fourth degree of freedom Z and for rotating the patterning device PD in a fifth and a sixth degree of freedom Rx, Ry. The patterning device may thus be accurately positioned for focussing and tilting of the pattern with respect to the radiation beam. The pattern support may be provided with flexible coupling devices 20, as illustrated, and/or a balance mass for the pattern support PS. The balance mass may prevent that large scan forces disturb delicate machine parts on the metrology frame MF and on the base frame BF.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A lithographic apparatus comprising:
   (a) an illumination system configured to condition a radiation beam;
   (b) a pattern support constructed to support a patterning device, the patterning device being capable of imparting the radiation beam with a pattern in its cross-section to form a patterned radiation beam, the pattern support being moveably supported by a first actuator assembly, the first actuator assembly comprising a long stroke actuator configured to position the patterning device with respect to a fixed reference point;
   (c) a substrate table constructed to hold a substrate, the substrate table being moveably supported by a second actuator assembly, the second actuator assembly comprising a long stroke actuator and a short stroke actuator configured to position the substrate with respect to the fixed reference point;
   (d) a projection system configured to project the patterned radiation beam onto a target portion of the substrate; and
   (e) a control system comprising
      (i) a determination system configured to determine an actual position of said patterning device, and
      (ii) control circuitry operatively connected to said determination system, said first actuator assembly, and said second actuator assembly, the control circuitry being configured to:
         position said patterning device to obtain a desired pattern position;
         determine a pattern positioning error by comparing said desired pattern position and said actual position of said patterning device;
         determine a desired substrate position to substantially compensate said pattern positioning error; and
         position said substrate at said desired substrate position.

2. The lithographic apparatus of claim 1, wherein the substrate and the patterning device move with respect to the illumination system during operation, and wherein the control system further comprises an acceleration error circuit configured to determine a pattern acceleration error by twice differentiating said actual position with respect to time, and a mass filter configured to filter said pattern acceleration error using mass characteristics of said substrate table for providing a compensation force corresponding to said pattern acceleration error to said substrate table.

3. The lithographic apparatus of claim 2, wherein the control system further comprises a time delay filter configured to compensate a time delay occurring in the acceleration error circuit when determining said pattern acceleration error from said positioning error.

4. The lithographic apparatus of claim 2, wherein the control system further comprises a prediction circuit configured to generate a future positioning error signal based on a previous positioning error and to pass said future positioning error signal to said control circuitry to substantially compensate said positioning error.

5. The lithographic apparatus of claim 1, wherein the pattern support comprises a short stroke actuator configured to position the patterning device to enable focusing and tilting of the pattern with respect to the radiation beam.

6. The lithographic apparatus of claim 1, wherein the determination system is an interferometer system.

7. The lithographic apparatus of claim 1, wherein the determination system is an encoder system.

8. A lithographic apparatus comprising:
(a) an illumination system configured to condition a radiation beam;
(b) a pattern support constructed to support a patterning device, the patterning device being capable of imparting the radiation beam with a pattern in its cross-section to form a patterned radiation beam, the pattern support being moveably supported by a first actuator assembly, the first actuator assembly comprising a long stroke actuator and a short stroke actuator configured to position the patterning device with respect to a fixed reference point;
(c) a substrate table constructed to hold a substrate, the substrate table being moveably supported by a second actuator assembly, the second actuator assembly comprising a long stroke actuator configured to position the substrate with respect to the fixed reference point;
(d) a projection system configured to project the patterned radiation beam onto a target portion of the substrate, and
(e) a control system comprising
(i) a determination system configured to determine an actual position of said substrate, and
(ii) control circuitry operatively connected to said determination system, said first actuator assembly, and said second actuator assembly, the control circuitry being configured to:
position said substrate to obtain a desired substrate position;
determine a substrate positioning error by comparing said desired substrate position and said actual position;
determine a desired patterning device position to substantially compensate said substrate positioning error; and
position said patterning device at said desired patterning device position.

9. The lithographic apparatus of claim 8, wherein the substrate and the patterning device move with respect to the illumination system during operation, and wherein the control system further comprises an acceleration error circuit configured to determine a substrate acceleration error by twice differentiating said actual position with respect to time, and a mass filter configured to filter said substrate acceleration error using mass characteristics of said pattern support for providing a compensation force corresponding to said substrate acceleration error to said pattern support.

10. The lithographic apparatus of claim 9, wherein the control system comprises a time delay filter configured to compensate a time delay occurring in the acceleration error circuit when determining said substrate acceleration error from said positioning error.

11. The lithographic apparatus of claim 9, wherein the control system comprises a prediction circuit configured to generate a future positioning error signal based on a previous positioning error and to pass said future positioning error signal to said control circuitry to substantially compensate said positioning error.

12. The lithographic apparatus of claim 8, wherein the determination system is an interferometer system.

13. The lithographic apparatus of claim 8, wherein the determination system is an encoder system.

14. A device manufacturing method comprising:
(a) patterning a beam of radiation with a patterning device to obtain a patterned beam of radiation;
(b) projecting the patterned beam of radiation onto a substrate, and
(c) controlling a position of the substrate, said controlling including
(i) determining an actual position of the patterning device;
(ii) positioning said patterning device to a desired patterning device position;
(iii) determining a patterning device positioning error by comparing said desired patterning device position and said actual position of said patterning device;
(iv) determining a desired substrate position to substantially compensate said patterning device positioning error; and
(v) positioning said substrate at said desired substrate position.

15. The method of claim 14, wherein said patterning device is moved by a first actuator assembly, said first actuator assembly comprising a long stroke actuator configured to position the patterning device with respect to a fixed reference point and wherein the substrate is moved by a second actuator assembly, said second actuator assembly comprising a long stroke actuator and a short stroke actuator configured to position the substrate with respect to the fixed reference point.

16. The method of claim 14, further comprising determining a patterning device acceleration error by twice differentiating said actual position with respect to time, and filtering said patterning device acceleration error using mass characteristics of a substrate table that holds said substrate for providing a compensation force corresponding to said patterning device acceleration error to said substrate table.

17. The method of claim 16, further comprising compensating a time delay occurring when determining said patterning device acceleration error from said positioning error.

18. The method of claim 16, further comprising generating a future positioning error signal based on a previous positioning error.

* * * * *